United States Patent [19]

Tengler et al.

[11] Patent Number: 4,941,831

[45] Date of Patent: Jul. 17, 1990

[54] COAXIAL CABLE TERMINATION SYSTEM

[75] Inventors: John N. Tengler, Chico, Calif.; John T. Venaleck, Madison, Ohio

[73] Assignee: Minnesota Mining and Manufacturing Co., Saint Paul, Minn.

[21] Appl. No.: 862,118

[22] Filed: May 12, 1986

[51] Int. Cl.[5] .............................................. H05K 1/00

[52] U.S. Cl. ...................................... 439/63; 439/579; 439/607

[58] Field of Search ........... 339/177 R, 177 E, 143 R, 339/14 R, 14 P, 242, 248 R, 17 C, 17 LC, 17 R, 103 R, 19, 119 R, 121, 125 R

[56] References Cited

U.S. PATENT DOCUMENTS

| | | | |
|---|---|---|---|
| 23,447 | 3/1987 | Tengler et al. . | |
| 701,112 | 2/1985 | Tengler et al. | 339/177 R |
| 3,109,997 | 11/1963 | Giger et al. | 339/177 R |
| 3,179,912 | 4/1965 | Huber et al. | 339/177 R |
| 3,335,388 | 8/1967 | Karol | 339/18 |
| 3,781,763 | 12/1973 | Feeser et al. | 339/91 |
| 3,825,874 | 7/1974 | Peverill | 339/143 R |
| 3,848,164 | 11/1974 | Otte | 317/256 |
| 4,231,629 | 11/1980 | Kirby | 339/177 E |
| 4,451,107 | 5/1984 | Dola et al. | 339/143 |
| 4,453,796 | 6/1984 | Monroe | 339/177 R |
| 4,519,665 | 5/1985 | Althouse et al. | 339/143 R |
| 4,603,926 | 8/1986 | Nesbit et al. | 339/177 R |

FOREIGN PATENT DOCUMENTS

| | | | |
|---|---|---|---|
| 2335361 | 2/1974 | Fed. Rep. of Germany | 339/177 R |

*Primary Examiner*—David Pirlot

*Attorney, Agent, or Firm*—Renner, Otto, Boisselle & Sklar

[57] ABSTRACT

A termination system for coupling to further circuitry one or more miniature coaxial cables terminated with respective impedance matched terminators each including a center signal contact and a concentric tubular sleeve contact having an external contact surface. The termination system includes a receptacle for a single terminator or a carrier block for a plurality of terminators. The receptacle includes a center pin contact extending along an axial extent of the receptacle, an outer tubular shell contact coaxially positioned with respect to the pin contact and having an internal contact surface for electrically connecting with the external contact surface of a terminator sleeve contact, and a spacer for maintaining electrical isolation and spaced relation of the pin and shell contacts for matching the impedance of the receptacle to that of the terminator and cable. The carrier block for a plurality of terminators is a conductive plate-like member having plural openings for receiving and electrically engaging with the external contact surface of respective terminator sleeve contacts thereby to couple the same to a common reference potential, such as ground reference potential, and is mountable and electrically connectable to a printed circuit board by a port member. The port member serves as a socket mount for the carrier block and, in the absence of a carrier block, serves to protect a plurality of pin contacts mounted to the printed circuit board for electrically connecting with the center signal contact of respective terminators held in the carrier block. Also disclosed are a resistance terminator and a shunt terminator.

34 Claims, 4 Drawing Sheets

FIG.5
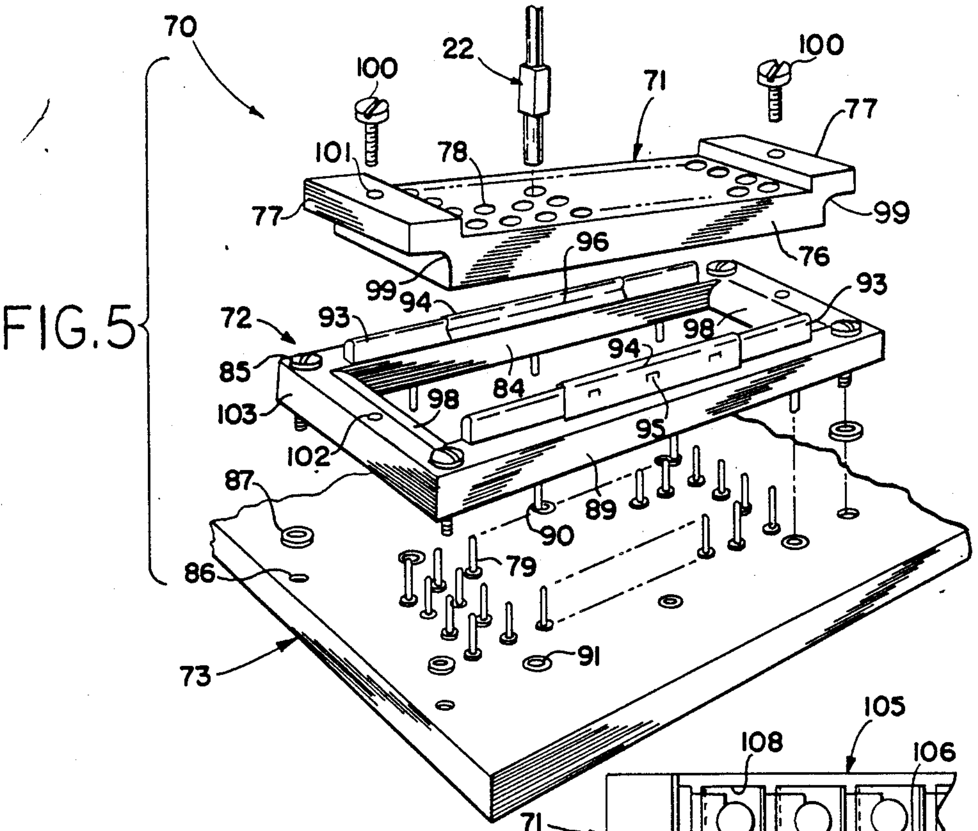
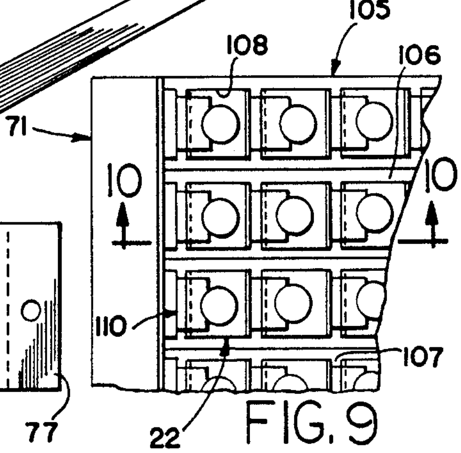
FIG.9
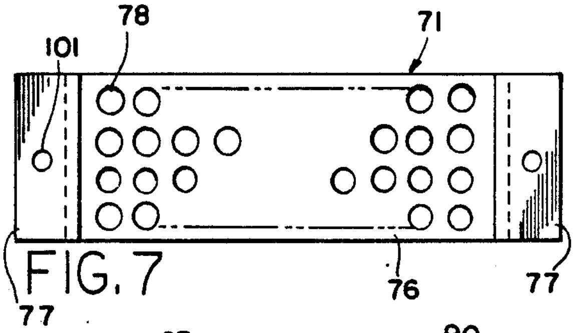
FIG.7
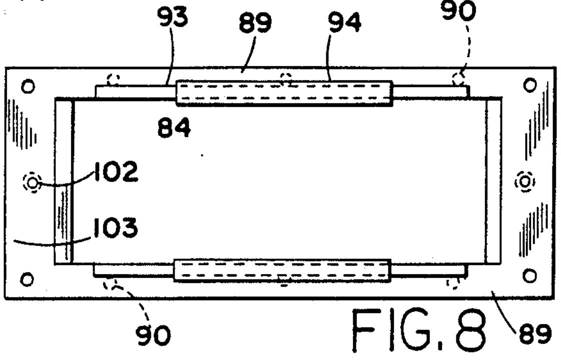
FIG.8
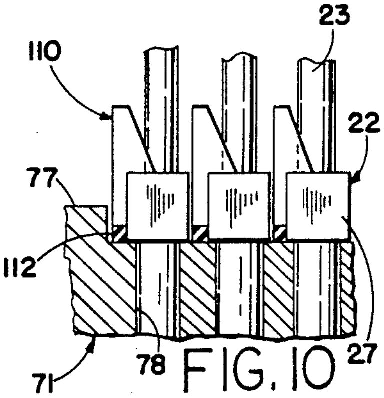
FIG.10

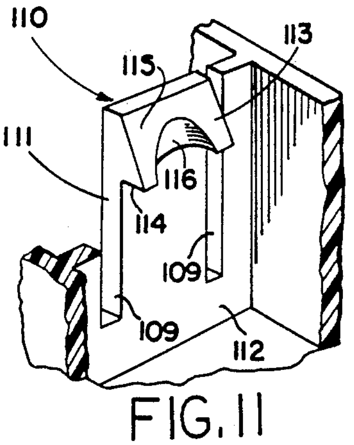
FIG. 11
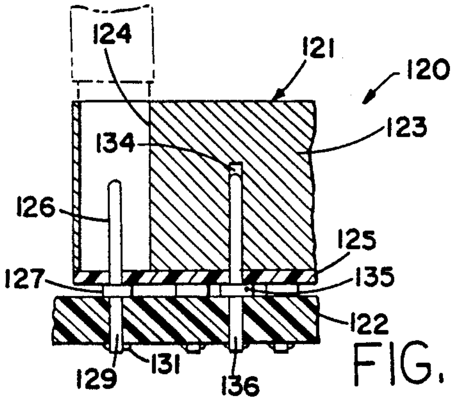
FIG. 13
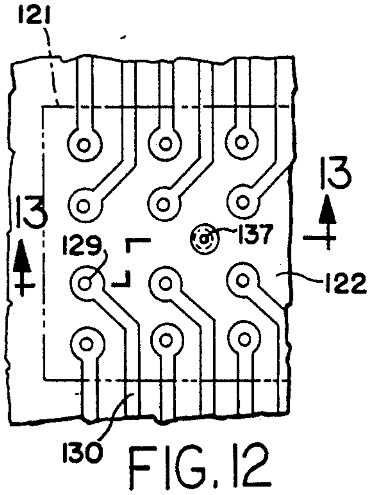
FIG. 12
FIG. 15
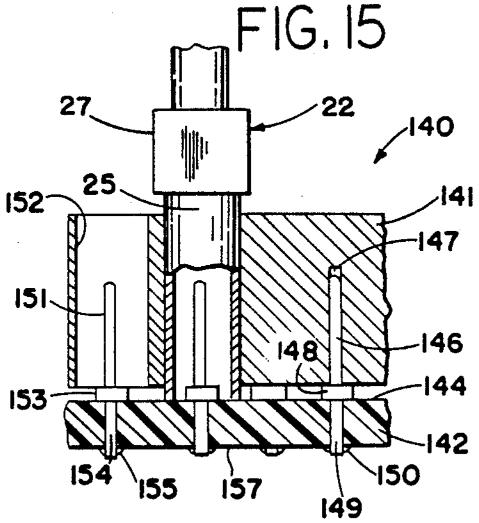
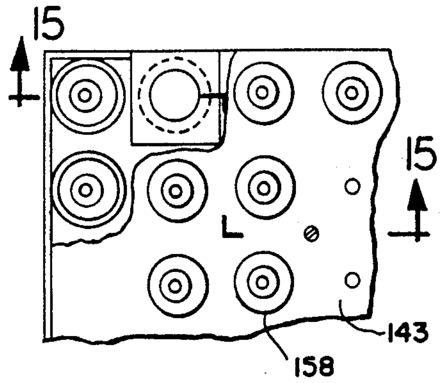
FIG. 14
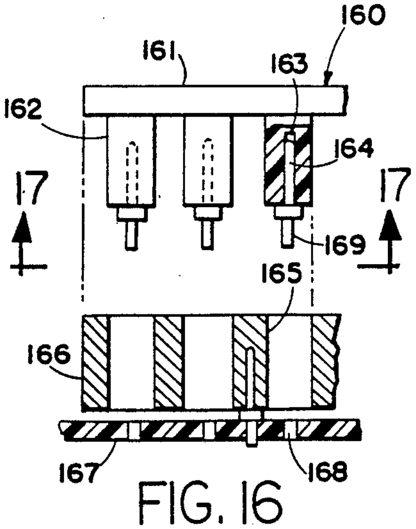
FIG. 16

COAXIAL CABLE TERMINATION SYSTEM

The invention herein described relates generally to a coaxial cable termination system and, more particularly, to a termination system for coupling one or more miniature coaxial cables terminated with respective terminators generally of the type described in copending application Ser. No. 701,112, filed Feb. 13, 1985, now Pat. No. 4,664,467 and entitled "Coaxial Cable Terminator".

BACKGROUND

Coaxial cables frequently are used for high speed signal transmission and/or accurate signal/data transmission purposes in cases where it is desired to maintain a ground or reference potential isolation or shielding of the signal conductor and signals carried thereby. Often coaxial cables are used in circumstances that require relatively accurate impedance characteristics. For example, a coaxial cable may have a characteristic impedance of 50 ohms.

Prior terminators for coaxial cables generally have been unable substantially to match the impedance of the cable. Therefore, due to the rather different impedance characteristics at the terminator, the overall impedance characteristic of the cable may be altered and/or signal degradation may occur. Also, with the occurrence of such different impedance characteristics of the cable and terminator, accurate impedance matching with respect to circuitry to which the cable and terminator assembly is coupled may not be possible. Also, prior terminators for coaxial cables have been relatively large in physical size. An example is a terminator referred to as a BNC connector. Such large terminators/connectors are unable to take advantage of the relative miniaturization of the coaxial cable adequate to carry certain signals. Thus, although the cables are miniaturized, the connectors are so large that relatively large space requirements are needed to effect termination and connection of the cables to other circuits, terminals, etc.

With the increasing use of coaxial cables in electrical and electronic equipment, it has become all the more important to be able to couple many coaxial cables in a relatively small space, i.e., in a close-packed arrangement, in order to minimize space requirements for the equipment. Indeed, as is well known, there is a constant striving to miniaturize electrical and electronic equipment. Compounding the difficulty in using mini-coaxial cables, especially mini-coaxial cables having cable diameters for example on the order of about 0.060 inch, are the inability to terminate the same in a close-packed arrangement while maintaining integrity of connections, shielding, and impedance matching to maximize signal coupling and to minimize signal degradation.

The foregoing observation respecting prior terminators for coaxial cables are generally applicable to prior termination devices used to couple the cable terminators to further circuit components such as a printed circuit board.

RELATED APPLICATION

In the above noted copending application Ser. No. 701,112, a miniature impedance matching terminator for a mini-coaxial cable is disclosed. The terminator includes an axially extending, center signal contact, a tubular sleeve contact coaxially positioned with respect to the signal contact for grounding or shielding, a spacer for maintaining electrical isolation and spaced relation of the contact, and a strain relief for mechanically securing the terminator to the coaxial cable. The signal contact is electrically connected to the generally centered conductor of the cable and the sleeve contact is electrically connected to the other or outer conductor of the cable. The sleeve contact has an external contact surface for electrically connecting with an external member such as an electrically conductive plate-like member having plural openings therethrough for receiving and electrically engaging with the external contact surface of the second contact of each terminator thereby to couple the same to a common reference potential, such as ground reference potential. As illustrated in such application, the openings in the conductive plate may be arranged in a relatively close-packed array, e.g., on 0.100 inch centers, to accommodate a relatively large number of terminators in a relatively small space. Together the conductive block and one or more terminators constitute a termination system.

SUMMARY OF THE INVENTION

The subject invention is directed to improvements in and relating to a termination system for coaxial cables and especially mini-coaxial cables terminated with terminators of the type disclosed in the above noted copending application. A terminator system according to the subject invention serves to continue the impedance characteristic of the cable from the terminator to a further circuit component such as a printed circuit board, while affording, among other things, convenience in the connection and disconnection of terminators, either singly or collectively, to and from the further circuit component, secure retention and holding of the terminator or terminators to the further circuit component, and a compactness or density heretofore not attainable by prior termination systems for coaxial cables.

According to one aspect of the invention, a receptacle for a single coaxial cable terminator, which has a center contact and an outer sleeve contact generally circumscribing the center contact along an axial extent of the terminator in electrically isolated and spaced relationship, comprises a center pin contact for electrically connecting with the center contact of the terminator, an outer shell contact having an interior contact surface for electrically connecting with an exterior contact surface of the terminator sleeve contact, such shell contact generally circumscribing the center pin contact along an axial extent thereof, and a spacer for maintaining electrical isolation and spaced relation of the center pin contact and outer shell contact for substantially matching the impedance of the receptacle to that of the coaxial cable and the terminator connected to the coaxial cable.

According to another aspect of the invention, a termination system for coaxial cables that each have a pair of conductors, one being generally centered to the cable relative to the other, and a characteristic impedance, comprises a plurality of terminators for respective coaxial cables, each terminator including a center contact connected to the generally centered conductor of the respective cable, an outer sleeve contact connected to the other conductor of the cable, the sleeve contact generally circumscribing the center contact over an axial extent of the terminator, a spacer for maintaining electrical isolation of the center contact and sleeve contact, the center contact, sleeve contact and spacer being cooperatively interrelated substantially to match the impedance of the coaxial cable, and a strain relief for mechanicaly securing the terminator to the coaxial cable; and a common electrically conductive member having plural openings therein for receiving and holding respective terminators for connection to respective external members by respective center contacts while effecting common electrical connection of the sleeve contacts.

According to still another aspect of the invention, a termination system for coaxial cables each having a pair of conductors, one generally centered relative to the other, comprises a plurality of terminators for respective coaxial cables, each terminator including a center contact electrically connected to the center conductor of the respective cable and a second contact electrically connected to the other conductor, the second contact generally circumscribing the center contact along an axial extent of the terminator, a spacer for maintaining electrical isolation and spaced relation of the contacts, and a strain relief for mechanically securing the terminator to the coaxial cable; a carrier including an array of openings therein for plug-in receipt and retention of respective terminators, the carrier including a common electrically conductive member forming at least a part of the openings for effecting common electrical connection of the second contacts of the terminators by connecting with an external surface of each second contact; a printed circuit board; a plurality of terminal pins mounted on the printed circuit board; and means for mounting the carrier on the printed circuit board with the terminal pins generally centered in respective openings of the carrier for electrically connecting with the center contacts of respective terminators, such means for mounting including a port member mounted to the printed circuit board, the port member including a socket-like opening for accommodating the terminal pins and for receiving the carrier, and means for securing the carrier to the port member.

According to a further aspect of the invention, a termination system for coaxial cables each having a pair of conductors, one generally centered relative to the other, and each terminated by a terminator including a center contact electrically connected to the center conductor of the respective cable and a second contact electrically connected to the other conductor, the second contact generally circumscribing the center contact along an axial extent of the terminator, and a strain relief for mechanically securing the terminator to the coaxial cable comprises a carrier including an array of openings therein for plug-in receipt and retention of a plurality of the terminators, respectively, the carrier including a common electrically conductive member forming at least a part of the openings for effecting common electrical connection of the second contacts of such terminators by connecting with an external surface of each second contact; and means for mounting the carrier to a printed circuit board with terminal pins on such board generally centered in respective openings of the carrier for electrically connecting with the center contacts of terminators held in the carrier, such means for mounting including a port member mountable to the printed circuit board, the port member including an opening for accommodating the terminal pins and for receiving the carrier, and means for securing the carrier to the port member.

The invention also provides a terminator for plug-in use in a termination system, comprising a center contact, a second contact generally circumscribing the center contact along an axial extent thereof, an electrical resistor connected between the contacts, and an electrically non-conductive body for mechanically securing together the center contact, outer sleeve contact and resistor. Also provided is a terminator for plug-in use in a termination system, comprising a center contact, an outer sleeve contact generally circumscribing the center contact along an axial extent thereof, a shunt for electrically interconnecting the contacts, and an electrically nonconductive body for mechanically securing together the contacts and shunt.

The foregoing and other features are hereinafter fully described and particularly pointed out in the claims, the following description and the annexed drawings setting forth in detail certain illustrative embodiments of the invention, these being indicative, however, of but a few of the various ways in which the principles of the invention may be employed.

BRIEF DESCRIPTION OF THE DRAWINGS

In said annexed drawings:

FIG. 5 is an exploded perspective view of another embodiment of a coaxial cable termination system according to the invention;

FIG. 7 is a top plan view of a carrier employed in the termination system of FIG. 5 as viewed in the direction of the arrows 7—7 of FIG. 6;

FIG. 8 is a top plan view of a port member utilized in the termination system of FIG. 5 as viewed in the direction of the arrows 8—8 of FIG. 6;

FIG. 9 is a fragmentary top plan view of the carrier showing usage of an optional terminator lock member;

FIG. 10 is a sectional view taken substantially along the line 10—10 of FIG. 9;

FIG. 11 is an enlarged fragmentary perspective view showing details of a representative latch provided in the lock member of FIG. 9;

FIG. 12 is a fragmentary bottom plan view of a further embodiment of a coaxial cable termination system according to the invention;

FIG. 13 is a fragmentary sectional view taken substantially along the line 13—13 of FIG. 12;

FIG. 14 is a fragmentary top plan view, partly broken away for illustration, of still another embodiment of a coaxial cable termination system according to the invention;

FIG. 15 is a fragmentary sectional view taken substantially along the line 15—15 of FIG. 14;

FIG. 16 is a fragmentary elevational view, partly broken away in section, showing a pin contact carrier according to the invention;

DETAILED DESCRIPTION

Figure 1:
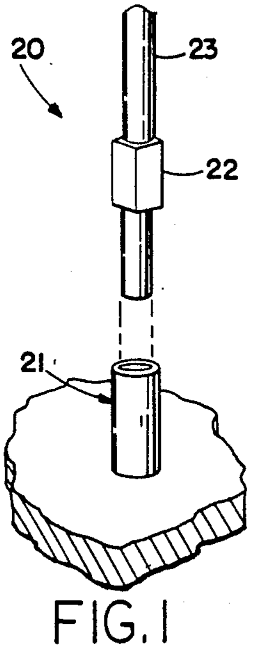
FIG. 1 is a perspective view of a coaxial cable termination system according to the invention.
Figure 2:
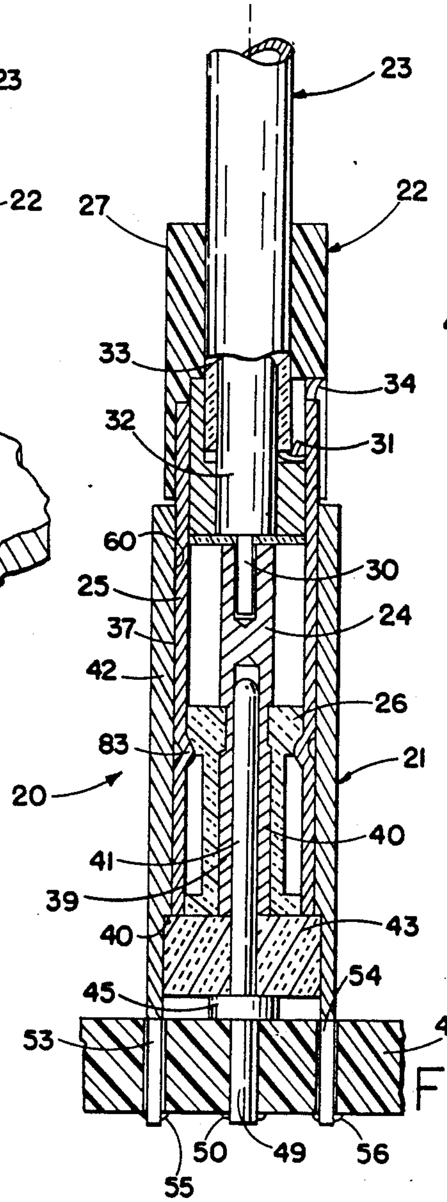
FIG. 2 is an enlarged axial sectional view through the termination system of FIG. 1.

Referring now in detail to the drawings and initially to FIGS. 1 and 2, one embodiment of a coaxial cable termination system according to the subject invention is indicated generally at 20. The termination system 20 includes a receptacle 21 and a terminator 22 which is connected to a coaxial cable 23. The terminator 22, which is insertable into and removable from the receptacle 21, preferably is of the type described in the above noted copending application Ser. No. 701,112, which is hereby incorporated herein by reference. Accordingly, the terminator includes a center contact 24, also herein referred to as a signal contact, a second contact 25, also herein referred to as a sleeve contact, a spacer 26, and a strain relief 27. As discussed in such copending application, the parts of the terminator cooperate to form a physical extension of the cable 23 having an impedance characteristic substantially matched to that of the cable. In the illustrated preferred embodiment, the coaxial cable is a conventional coaxial cable having a 50 ohm characteristic impedance.

The cable 23 includes a center conductor 30, also herein referred to as a signal conductor, which is located generally centrally of an electrically conductive shield 31. The conductor 30 and the shield 31 are separated by a layer of insulation 32, and a further layer of insulation 33 may surround the shield 31 as an outer protective jacket. The center conductor 30 is electrically connected to the center contact 24 of the terminator 22, and the shield 31 is electrically connected to the sleeve contact 25 of the terminator either directly or via a drain wire 34.

Exemplary use of the cable 23 would be the transmission of high speed electrical signals used to carry information or data. Such signals would be carried on the signal conductor 30, and electrical isolation/shielding therefor ordinarily would be provided by the shield 31 coupled, as is typical, to a source of reference potential such as to a ground. For purposes of this detailed description, such exemplary use of the cable will be assumed, it however being understood that the cable may be used for other purposes as well.

For such assumed application, the sleeve contact 25 may be referred to as the ground contact. Such ground contact is in the form of a generally tubular sleeve of hollow cylindrical configuration. The sleeve contact has a substantial external contact surface 37 intended for good electrical contact and strong mechanical support by a corresponding internal contact surface of the receptacle 21 to be described.

On the other hand, the center or signal contact 24 of the terminator 22 may include a pair of contact tines 39 and 40 of arcuate cross-section. For the most part, the signal contact is of generally elongate hollow tubular shape, and the tines are resiliently deformable to provide an interference fit with and wiping of a pin contact, such as the pin contact seen at 41, when the pin contact is inserted between the tines.

For further details of the preferred terminator and its connection to the coaxial cable, reference may be had to the above noted copending application Ser. No. 701,112.

Figure 4:
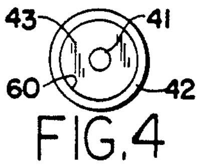
FIG. 4 is a top plan view of the receptacle looking generally in the direction of the arrows 4—4 of FIG. 3.
Figure 3:
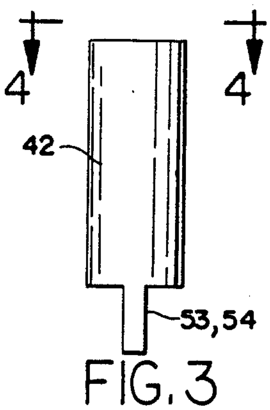
FIG. 3 is an enlarged elevational view of a receptacle employed in the termination system of FIG. 1.
Figure 6:
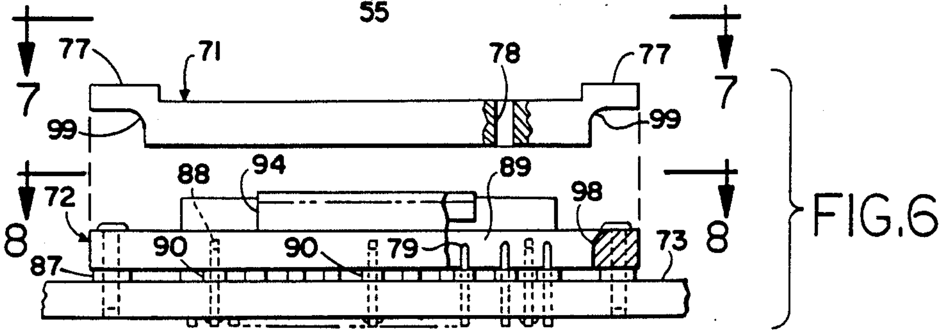
FIG. 6 is an exploded elevational view, partly broken away in section, of the termination system of FIG. 5.

With additional reference to FIGS. 3 and 4, the receptacle 21 includes the above indicated pin contact 41, also herein referred to as the signal contact of the receptacle, a second electrically conducting member 42 generally concentric with the pin contact, and a spacer 43. The second conducting member 42 is in the form of a generally tubular sleeve of hollow cylindrical configuration and is herein referred to as the outer or shell contact of the receptacle. The interior surface of the shell contact is stepped at 44 to provide an abutment stop for the spacer 43 which may be in the form of a washer made of a suitable electrically nonconductive material. The spacer or washer 43 preferably is press fitted into the lower end of the shell contact against the abutment stop 44, and the pin contact 41 preferably is press fitted into a center hole in the washer 43. In this manner, the pin contact, washer and shell contact are maintained in assembled relationship with the washer serving to hold the pin contact concentric with and electrically isolated from the shell contact. The pin contact also can be seen to have an integral collar 45 which engages the underside of the spacer properly to locate axially the pin contact in the receptacle 21.

The lower end of the receptacle 21, as viewed in FIGS. 2 and 3, is configured for electrical and mechanical connection to a supporting member such as the printed circuit board 48. More particularly, the pin contact 41 has a lower end portion 49, depending from the collar 45, which may be supported in a hole in the printed circuit board 48. The lower end portion 49 preferably extends beneath the printed circuit board for soldered connection at 50 to a printed circuit trace on the bottom surface of the printed circuit board.

The shell contact 42 is provided at its lower end with a pair of diametrically opposed, depending tabs 53 nd 54 which also may pass through and be supported in respective holes in the printed circuit board 48. The tabs 53 and 54 preferably extend beneath the printed circuit board for soldered connection at 55 and 56 to a printed circuit trace, such as a ground trace, on the bottom surface of the printed circuit board. Although the pin contact and shell contact are shown electrically connected to circuit traces on the bottom surface of the printed circuit board, electrical connection could be otherwise effected, say to a trace on the top surface of the printed circuit board. Also, mounting of the receptacle may be otherwise effected. For example, the tabs 53 and 54 may be soldered to circuit traces on the top surface of the printed circuit board, desirably after being shortened and/or bent outwardly to facilitate positioning and soldering. In this manner, signal traces may be provded on the bottom surface or signal plane of the circuit board and ground traces on the top surface or ground plane of the printed circuit board.

Above the spacer 43, the shell contact 42 has a substantial internal generally cylindrical contact surface 60 intended to engage directly with the external generally cylindrical contact surface 37 of the terminator sleeve contact 25 for good electrical contact therewith and strong mechanical support thereof. The axial length of such internal contact surface 60 preferably is about equal the distance from the bottom of the strain relief 27 to the leading end of the sleeve contact 25 of the terminator 22 for maximizing the connection surface area between the shell contact and sleeve contact and further to optimize the shielding function effected by the shell contact. On the other hand, the pin contact 41 terminates short of the top end of the shell contact to permit full insertion of the terminator in the receptacle with the leading end of the terminator sleeve contact abutting or close to the top side of the spacer 43.

The diameters of the pin contact 41 and shell contact 42, the spacing thereof relative to each other, and the impedance characteristic of the spacer 43 may be computed to achieve the desired impedance match with the cable 23, and the shape and orientation of the contacts yields a coaxial configuration and electrical appearance similar to that of the cable conductors, this being likewise effected in the terminator 22. When the terminator is plugged into the receptacle 21, the terminator effects matched impedance up to about the top end of the pin contact 41 and then the receptacle in cooperation with the terminator provides desired matched impedance up to the top surface of the printed circuit board 48 which may be of impedance controlled design.

In FIGS. 5–8, another coaxial cable termination system according to the subject invention is indicated generally at 70. The system 70 includes a carrier 71 for a plurality of cable terminators 22 and a port member 72 securable to a support such as a printed circuit board 73.

The carrier 71, also herein referred to as a port mount or disconnect block, preferably is an electrically conductive aluminum plate having a central block portion 76 and mounting arm portions 77 at respective opposite ends of the central block portion 76. The central block portion 76 has formed therein a plurality of terminator receiving openings or holes 78 which are arranged in a relatively close-packed array, e.g., on 0.100 inch centers, to accommodate a relatively large number of terminators 22 in a relatively small space. The terminators may be securely plugged in respective openings 78 yet are easily removable. The interior surfaces bounding respective openings in the carrier are intended for wiping engagement and electrical connection with the exterior contact surface of the sleeve contacts 25 (FIG. 2) of respective terminators 22 to effect a common connection therebetween and, for example, to a source of ground reference potential or other reference potential to which the carrier is electrically connected such as in the manner hereinafter described. Also, such engagement provides for strong mechanical support and retention of the terminators in the carrier whereupon the carrier serves as a holder for commonly manipulating a plurality of terminators plugged therein such as for common insertion into the port member 72 for electrical connection of the terminators to respective pins 79 mounted to the printed circuit board 73. The carrier may be plated with a highly conductive metal such as silver or gold for good conductivity.

Preferably the interior surface of each opening 78 is generally cylindrical as is the shape of the terminator sleeve contacts 42, and the two of a size that assures the desired electrical connection thereof and mechaical retention when the terminator 22 is plugged into the carrier 71. To promote such secure retention while permitting easy removal and insertion, the sleeve contact 42 of each terminator preferably is slightly elliptical in cross-section for resilient deformation to a circular cross-section upon insertion into a circular opening 78 in the carrier, the resilience serving to enhance the holding force keeping the terminator in the carrier. Such elliptical or oval shape may be imparted to the sleeve contact during formation of the dimples 83 (FIG. 2) used to retain the spacer 26 therein. The insertion and withdrawal forces may be, for example, 0.7 lbs nominal.

The port member 72 preferably is an electrically conductive aluminum frame plate which has a socket opening 84 for receiving the central block portion 76 of the carrier 71. The port member is intended to be mounted to the printed circuit board 73 by fasteners 85 at respective corners through screw holes 86 in the printed circuit board. If desired, the port member may be spaced away from the printed circuit board by an appropriate insulator, spacer, etc., such as the electrically nonconductive washers 87 provided at each screw fastener 85. Such insulated spacing would allow for circuits or traces to be printed on the surface of the circuit board facing the port member. Press fitted into holes 88 opening to the bottom side of the side rails 89 of the port member are electrically conductive pins 90 at locations spaced along such side rails. As shown, three such pins are provided for each side rail and the pins depend from the side rails for insertion into and electrical connection with respective plated through holes 91 in the printed circuit board 73 for electrically connecting the port member 72, for example, to a circuit trace on the printed circuit board such as a ground path for maintaining the port member at ground potential.

The side rails 89 are also provided at their top sides with respective relatively narrow, upright lips or flanges 93 over which respective ground clips 94 are placed and secured in place by inwardly bent locking detents 95. Each ground clip is generally U-shape in cross-section with the locking detents 95 being bent inwardly from the outer leg. The inner leg is bent inwardly and then outwardly into a relatively wide angle V-shape with the vertex 96 of the V engaging the inner side surface of the respective flange 93 which is substantially coplanar with a respective side surface of the socket opening 84. The deformed or bent inner legs of the ground clips provides a resiliency characteristic and an interference fit with and wiping of respective side surfaces of the carrier 71 when the carrier is inserted into the socket opening 84. The ground clips also serve to guide and center the carrier block 71 transversely in the port member 72 during such insertion, and the ground clips wipe against respective sides of the carrier block for good electrical connection therewith. In this manner, the carrier 71 may be electrically connected, for example, to a source of reference potential such as to a ground via the port member, the ground pins 90 and the plated through holes 91.

The carrier 71 further is guided into proper positional relation to the port member 72 by curved end surfaces 98 of the socket opening 84. The curved end surfaces 98 serve to engage and thus guide correspondingly curved end surfaces 99 of the central block portion 76 of the carrier. Preferably such corresponding surfaces 99 are configured to engage and substantially center the carrier with respect to the socket opening 84 prior to the center contacts of terminators held in the carrier engaging the pins 79 on the printed circuit board 73. The pin 79 are mounted on the printed circuit board in an array corresponding to that of the openings 78 in the carrier block for electrical connection to the center contacts 24 (FIG. 2) of the terminators. When the carrier is fully inserted into the port member, it may be held in place by screw fasteners 1000 through holes 101 in the arm portions 77 and threaded holes 102 in the end rails 103 of the port member 72.

As will be appreciated, a plurality of terminators 22 may be plugged into the carrier 71 to form a multiple terminator plug assembly that may be plugged as a unit into the port member 72 for electrical connection of the signal contact 24 (FIG. 2) of each terminator with a respective pin 79 on the printed circuit board 73. It is noted that the force needed to withdraw a terminator from the carrier, for example 0.7 lbs. nominal, should necessarily be greater than the insertion force of the pin 79 into the center signal contact 40 (FIG. 2) of the terminator, for example 0.25 lbs. nominal, or otherwise the terminator could be pushed out of the carrier. Of course, the carrier might be first installed in the port member and then the terminators individually plugged into the carrier. In either case, the carrier or disconnect block could thereafter be removed from the port member to effect simultaneous disconnection of the terminators from the printed circuit board. It is noted that such withdrawal force could be substantial because such force must overcome the sum of the individual forces needed to withdraw the center contact 24 (FIG. 2) of each terminator out of engagement with a respective pin 79. To facilitate such decoupling of the carrier block, the fasteners 99 securing the carrier block to the port member may be in the form of jackscrews. Of course, at any time, individual terminators may be withdrawn from the carrier block.

Preferably the thickness or height of the carrier block 71 above the printed circuit board 73 is adequate to provide mechanical support for the terminators 22 and to provide desired shielding of electrical signals and isolation of signals carried by respective terminators 22.

When the carrier 71 is not received in the port member 72, the port member advantageously serves to surround and protect the pins 79. The port member also ensures proper locating and guidance of the carrier and, more particularly, the terminators 22 held in the carrier, with respect to the pins 79 on the printed circuit board 73, thereby to ensure proper alignment between the terminators and pins and also to protect against bending of the pins that might result from misalignment between such pins and the terminators.

Referring now to FIGS. 9–11, it will be seen that the carrier 71 may be optionally provided with a lock member 105 for more positive locking of the terminators 22 in respective openings 78 in the carrier. The lock member 105 preferably is a plate formed from electrically nonconductive material such as plastic or plastic-like material which is secured to the top side of the central block portion 76 of the carrier between the arm portions 77 by suitable means such as rivets. The lock plate 105 has a plurality of laterally spaced longitudinal walls 106 and a plurality of longitudinally spaced transverse walls 107 which define therebetween a plurality of openings 108 aligned with respective openings 78 in the carrier. At one side of each opening in the lock plate the respective transverse wall 107 is formed with vertical recesses 109 defining therebetween a resiliently deflectable latch 110. The latch 110 has an arm portion 111 extending upwardly from a lower end portion 112 of the transverse wall, which terminates at an inwardly protruding detent 113. The detent has a bottom horizontal surface 114 and a sloped inner surface 115. When a terminator is inserted through a respective opening 108 in the lock plate, the strain relief 27 thereof will engage the sloped inner surface 115 of the detent 110 to deflect the detent outwardly. When the strain relief passes beneath the detent, the latch will flex back with the detent being located atop the strain relief of the terminator thereby to provide an axial mechanical interference preventing removal of the terminator from the carrier. As seen in FIG. 11, the inner side of the detent is provided with a centrally located curved recess 116 to accommodate the cable 23, to which the terminator is connected, when the terminator is fully inserted into the carrier. To effect removal of the terminator from the carrier, the latch need only be deflected outwardly to clear the strain relief of the terminator whereupon the terminator may be withdrawn from the carrier. Preferably enough looseness is provided to permit extraction of one but not two terminators at any one time.

Referring now to FIGS. 12 and 13, another coaxial cable termination system according to the invention is indicated generally at 120. The system 120 includes a socket connector 121 mounted on a printed circuit board 122. The connector 121 includes an electrically conductive member 123, preferably an electrically conductive aluminum plate, which has a plurality of terminator receiving openings 124 therein arranged in a relatively close-packed array to accommodate a relatively larger number of terminators within a relatively small space. Details respecting the openings 124 and engagement of terminators therein are essentially the same as those discussed above in connection with the carrier 71. Unlike the carrier 71, the socket connector 121 further includes an electrically non-conducting bottom member 125 secured to the underside of the conductive member 123. The non-conductive member 125 preferably is a relatively thin plate which spans the entire bottom surface of the conductive member 123 and consequently closes the bottom ends of the openings 124 in the conductive member. Concentric with each opening 124 in the conductive member, the non-conductive member 125 has a respective hole for receiving a respective pin contact 126 and concentrically locating such pin contact in relation to the opening 124. Each pin contact 126 preferably is press fitted into the hole with an integral collar 127 thereof engaging the underside of the non-conductive member properly to locate axially the pin contact in the respective opening 124 in the conductive member 123.

Each pin contact 126 has a lower end portion 129 depending from the collar 127 which may be supported in a respective hole in the printed circuit board 122. The lower end portion preferably extends beneath the printed circuit board for connection to a respective printed circuit trace 130 on the bottom surface of the printed circuit board as by soldering at 131. In this manner, the connector 121 is both electrically connected and mechanically mounted to the printed circuit board. The printed circuit board may be of impedance controlled design, the printed circuit board thickness and the trace widths being variables.

The connector 121 also includes at least one and preferably plural ground pin contacts 133. The ground pin contacts 133 are press fitted into holes 134 in the conductive member 123 between openings 124 therein. Each ground pin contact may be and preferably is identical to the signal pin contacts 126 and, as shown, such contact has a collar portion 135 engaging the bottom side of the non-conductive member 125 and a depending end portion 136 which may be supported in a hole in the printed circuit board such as the plated through hole 137 to provide for electrical connection of the conductive member to a reference potential such as to ground.

As will be appreciated, the connector 121 may be easily assembled to a printed circuit board and secured such as by soldering in the manner indicated.

In FIGS. 14 and 15, another form of a coaxial cable termination system according to the invention is indicated generally at 140. In this system, a common electrically conductive member 141 is employed to mount a plurality of the terminators 22 to a printed circuit board 142 with provision being made for direct electrical connection between the sleeve contact 25 of the terminator and electrically conductive plating 143 on the top surface 144 of the printed circuit board forming a ground plane. The electrically conductive member 141 essentially is the same as the electrically conductive member 123 of the FIGS. 12 and 13 embodiment with the additional requirement that the height or thickness of the electrically conductive member 141 be less than the overall length of the sleeve contact 25 protruding beyond the strain relief 27 of the terminator 22. The conductive member 141 is mounted to the printed circuit board 142 by ground pins 146 press fitted into respective holes 147 therein with the collar 148 thereof electrically and mechanically engaged between the bottom surface of the conductive member and the plating or conductive layer 143 on the top surface 144 or ground plane of the printed circuit board. As before, each ground in 146 has a depending portion 149 extending through the printed circuit board for connection as by soldering at the bottom side of the printed circuit board as seen at 150. In this system, the signal pins represented at 151 are mounted to the printed circuit board 142 at the center of respective openings 152 in the conductive member 141. The collar portions 153 of the signal pins 151 serve to properly axially locate the pin in relation to the printed circuit board and the conductive member, and the depending portion 154 thereof extends through a hole in the printed circuit board for soldered connection at 155 to a printed circuit trace on the bottom surface or signal plane 157 of the printed circuit board.

As seen in FIG. 14, the top surface 144 of the printed circuit board 142 is not plated at circular areas 158 surrounding respective signal pins 151. Such areas 158 are preferably circular and concentric with the axis of the signal pin. Also, the diameter of each unplated circular area 158 of the top surface of the printed circuit board is smaller than the diameter of the corresponding opening 152 in the conductive member 141 preferably by about twice the thickness of the cylindrical wall of the sleeve contact 25 of the respective terminator 22, and thus overlaps a vertically projected area of the opening. Accordingly, when a terminator 22 is plugged into the conductive member as shown, the sleeve contact 25 may project below the bottom surface of the conductive member to effect electrical contact with the plating 143 on the top surface of the printed circuit board.

Figure 17:
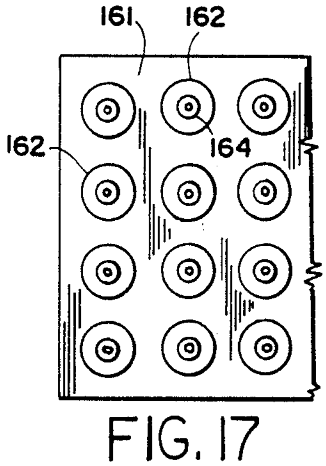
FIG. 17 is a fragmentary bottom plan view of the pin contact carrier looking generally in the direction of the arrows 17—17 of FIG. 16.

As one can appreciate, the mounting of a plurality of signal pins to a printed circuit board in a prescribed close packed array, such as seen in FIG. 5 or FIG. 14, for example, presents a difficult and tedious task. In FIGS. 16 and 17, there is shown a pin carrier 160 which greatly facilitates this task. The carrier 160 preferably of molded plastic material and includes a platelike base portion 161 from which a plurality of pin holders 162 depend. Each pin holder 162 includes a coaxial hole 163 for receiving and holding as with a friction fit the contact portion of a respective pin 164. The holders are spaced apart and arranged in a pattern corresponding to the desired pattern in which the pins are to be mounted to a printed circuit board 167. Also, the holders are externally dimensioned for receipt in respective holes 165 of an electrically conductive member 166 which has already been mounted to the printed circuit board 167 in proper positional relationship to holes 168 intended to receive the mounting end portions 169 of the pins 164. The holders may be of any desired cross-sectional shaped which preferably provides for concentric locating of the holders in respective openings 165 in the conductive member 166. As is preferred, the holders are of circular cross-section closely corresponding in diameter to the diameter of the openings 165 in the conductive member.

In use, the pins 164 may be loaded into the carrier 160 as shown and then, with the pins held by the carrier, the carrier may be inserted into the conductive member 166 with the holders thereof being located in respective openings 165 in the conductive member 166 and further with the mounting end portions 169 of the pins extending through respective holes 168 in the printed circuit board 167. The mounting end portions of the pins projecting beneath the printed circuit board then may be soldered to respective circuit traces on the bottom surface of the printed circuit board. Once the pins have been thusly soldered into place, the holder may be removed from the conductive member with the pins staying with the printed circuit board by reason of their soldered connection thereto. In addition to facilitating the mounting of the pins to the printed circuit board, the carrier ensures that the pins will be properly coaxially positioned in relation to respective openings 152 in the conductive member. The carrier may have use in the assembly of the termination systems shown in FIGS. 5–8 and FIGS. 14 and 15.

Figure 19:
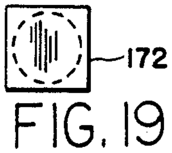
FIG. 19 is a top plan view of the resistor terminator.
Figure 18:
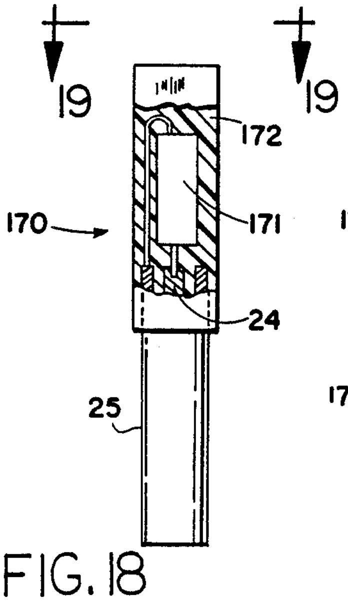
FIG. 18 is an elevational view, partly broken away in section, of a resistor terminator according to the invention.

In FIGS. 18 and 19, a special form of terminator is shown which may be optionally used in any of the above described coaxial cable termination assemblies. The terminator, indicated at 170, may be used to effect a resistance connection between a signal pin and a common electrically conductive member of such assemblies by simply inserting the resistor terminator into the respective opening in the carrier block or other electrically conductive member of such systems, such as an opening 78 in the carrier 71 of FIG. 5. The resistor terminator 170 is substantially similar to the terminator 22 (FIG. 2) except that the center contact 24 and sleeve contact 25 are connected to respective ends of a resistor 171 rather than to respective conductors of a cable. Once such electrical connection between the lead wires of the resistor 171 and the contacts has been effected, an electrically non-conductive body 172 is molded onto the resistor and adjacent end of the contacts to form a hermetic seal, a mechanical retainer vis-a-vis those portions of the terminator, and a handle to enable insertion and removal of the terminator. The body 172 preferably is of like cross-sectional shape and size to the strain relief 27 of the terminator 22 (FIG. 2) although the axial length may be greater as needed or desired.

Figure 20:
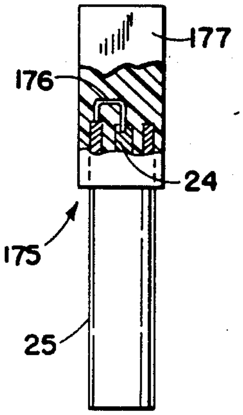
FIG. 20 is an elevational view, partly broken away in section, of a shorting plug according to the invention.

In FIG. 20, another optional accessory is indicated at 175. The accessory 175 is a shorting plug which is essentially identical to the resistor terminator 170 except that the resistor has been omitted and a shorting wire 176 connected between the center contact 24 and sleeve contact 25. Again there is provided a molded body 177 for the above indicated reasons. The shorting plug may be plugged into an opening in the conductive member in any of the aforedescribed systems to provide a direct electrical connection between the associated pin contact and the conductive member.

Although the invention has been shown and described with respect to preferred embodiments, it is obvious that equivalent alterations and modifications will occur to others skilled in the art upon the reading and understanding of the specification. The present invention includes all such equivalent alterations and modifications, and is limited only by the scope of the following claims.

We claim:

1. A termination system for coaxial cables that each have a pair of conductors, one being generally centered to the cable relative to the other, and a characteristic impedance, comprising:

a plurality of terminators for respective coaxial cables, each terminator including a center contact connected to the generally centered conductor of the respective cable, an outer sleeve contact connected to the other conductor of the cable, said sleeve contact generally circumscribing said center contact over an axial extent of the terminator, spacer means for maintaining electrical isolation of said center contact and sleeve contact, said center contact, sleeve contact and spacer means being cooperatively interrelated substantially to match the impedance of the coaxial cable, and strain relief means for mechanically securing the terminator to such coaxial cable;

a common electrically conductive member having plural openings therein for receiving and holding respective terminators while effecting common electrical connection of said sleeve contacts;

a printed circuit board having a top surface and a conductive layer on said top surface; and means for mounting said common electrically conductive member to said printed circuit board in spaced relation to said conductive layer with at least one hole in said common electrically conductive member partly overlapping a portion of said conductive layer, and at least one of said plurality of terminators being receivedin said one hole with its sleeve contact projecting beneath a bottom surface of said electrically conductive member and into electrical contact with the overlapped portion of said conductive layer.

2. A system as set forth in claim 1, further comprising a plurality of terminal pins mounted to said printed circuit board, said terminal pins being generally centered in respective said openings in said common electrically conductive member for electrically connecting with said center contacts of respective said terminators, and said conductive layer being spaced from said terminal pins.

3. A system as set forth in claim 1, further comprising a plurality of terminal pins mounted to said printed circuit board, and said terminal pins being generally centered in respective openings of said common electrically conductive member.

4. A system as set forth in claim 1, wherein said common electrically conductive member includes a metal plate.

5. A system as set forth in claim 4, wherein said sleeve contact of each terminator has one end secured within said strain relief means and an opposite end externally exposed for electrical connection to said metal plate, and said metal plate has generally parallel top and bottom surfaces between which said openings extend, said top and bottom surfaces defining a height of such plate which is less than the axial extent of said externally exposed opposite end of said sleeve contact.

6. A termination system for coaxial cables each having a pair of conductors, one generally centered relative to the other, comprising:

a plurality of terminators for respective coaxial cables, each terminator including a center contact electrically connected to the center conductor of the respective cable and a second content electrically connected to the other conductor, said second contact generally circumscribing said center contact along an axial extent of the terminator, spacer means for maintaining electrical isolation and spaced relation of said contacts, and strain relief means for mechanically securing the terminator to the coaxial cable;

carrier means including an array of openings therein for plug-in receipt and retention of respective terminators, said carrier means including a common electrically conductive member forming at least a part of said openings for effecting common electrical connection of said second contacts of said terminators by connecting with an external surface of each said second contact;

a printed circuit board;

a plurality of terminal pins mounted on said printed circuit board; and means for mounting said carrier means on said printed circuit board with said terminal pins generally centered in respective openings of said carrier means for electrically connecting with said center contacts of respective terminators, said means for mounting including a port member mounted to said printed circuit board, said port member including a socket-like opening for accommodating said terminal pins and for receiving said carrier means.

7. A system as set forth in claim 6, wherein said center contact of each terminator has an interior space for insertion of a respective terminal pin therein to effect electrical connection therebetween, and each terminator is retained in said carrier means such that the force needed to withdraw the terminator is greater than the force needed to insert the respective terminal pin into the center contact of such terminator.

8. A system as set forth in claim 6, wherein said means for mounting includes means for securing said carrier means to said port member.

9. A system as set forth in claim 1, wherein said socket-like opening has opposed end surfaces which serve to engage and guide respective ends of said carrier means for proper positioning of said carrier means in relation to said port member.

10. A system as set forth in claim 9, wherein said opposed end surfaces are curved and said carrier means has correspondingly curved end surfaces for engaging said opposed end surfaces.

11. A system as set forth in claim 6, wherein said port member has a flange generally contiguous with a side of said socket-like opening, and a spring member attached to said flange, said spring member having an inwardly biased portion for resiliently engaging a side of said carrier means.

12. A system as set forth in claim 11, wherein said spring member is made of electrically conductive material to electrically connect said carrier means to said port member which also is made of electrically conductive material.

13. A system as set forth in claim 6, wherein said printed circuit board includes at least one plated through hole, and said port member includes a hole aligned with said plated through hole, and including pin means having opposite ends respectively received in said hole in said port member and said plated through hole.

14. A system as set forth in claim 13, wherein said pin means includes flange means engageable between said port member and printed circuit board to space said port member from said printed circuit board.

15. A system as set forth in claim 6, including latching means of electrically non-conductive material mounted to said carrier means for locking said terminators in said carrier means.

16. A system as set forth in claim 15, wherein said latching means includes a lock member having a plurality of openings for receiving the strain relief means of respective terminators and resilient hook members associated with respective openings for engaging the strain relief means of respective terminators to lock said terminators in said carrier means, said hook members being resiliently deflectable to permit release of said terminators.

17. A system as set forth in claim 16, wherein said means for securing said carrier means to said port member includes at least one jack screw.

18. A termination system for coaxial cables each having a pair of conductors, one generally centered relative to the other, and each terminated by a terminator including a center contact electrically connected to the center conductor of the respective cable and a second contact electrically connected to the other conductor, the second contact generally circumscribing the center contact along an axial extent of the terminator, and a strain relief for mechanically securing the terminator to the coaxial cable comprising:

carrier means including an array of openings therein for plug-in receipt and retention of a plurality of the terminators, respectively, said carrier means including a common electrically conductive member forming at least a part of said openings for effecting common electrical connection of the second contacts of such terminators by connecting with an external surface of each second contact; and means for mounting said carrier means to a printed circuit board with terminal pins on such board generally centered in respective openings of said carrier means for electrically connecting with the center contacts of terminators held in said carrier means, said means for mounting including a port member mountable to the printed circuit board, said port member including a socket-like opening for accommodating the terminal pins and for receiving said carrier means.

19. A system as set forth in claim 18, including at least one pin secured to said port member, said pin having an end thereof depending from said port member adapted for receipt in a plated-through hole in the printed circuit board.

20. A system as set forth in claim 18, wherein said means for mounting includes means for securing said carrier means to said port member.

21. A system as set forth in claim 18, wherein said socket-like opening has opposed end surfaces which serve to engage and guide respective ends of said carrier means for proper positioning of said carrier means in relation to said port member.

22. A system as set forth in claim 21, wherein said opposed end surfaces are curved and said carrier means has correspondingly curved and surfaces for engaging said opposed end surfaces.

23. A system as set forth in claim 18, wherein said port member has a flange generally contiguous with a side of said socket-like opeing, and a spring member attached to said flange, said spring member having an inwardly biased portion resiliently engaging a side of said carrier means.

24. A system as set forth in claim 23, wherein said spring member is made of electrically conductive material electrically to connect said carrier means to said port member which also is made of electrically conductive material.

25. A system as set forth in claim 18, including latching means of electrically non-conductive material mounted to said carrier means for locking the terminators in said carrier means.

26. A system as set forth in claim 25, wherein said latching means includes a lock member having a plurality of openings for receiving the strain relief of respective terminators and resilient hook members associated with respective openings for engaging the strain relief of respective terminators to lock the terminators in said carrier means, said hook members being resiliently deflectable to permit release of the terminators.

27. A terminator for plug-in use in a termination system, comprising a center contact, a second contact generally circumscribing said center contact along an axial extent thereof, an electrical resistor connected between said contacts, and electrically nonconductive body means for mechanically securing together said center contact, outer sleeve contact and resistor, said body means being molded about at least a part of each of said contact, outer sleeve contact and resistor.

28. A terinator for plug-in use in a termination system, comprising a center contact, an outer sleeve contact generally circumscribing said center contact along an axial extent thereof, shunt means for electrically interconnecting said contacts, and electrically nonconductive body means for mechanically securing together said contacts and shunt means, said body means being molded about at least a part of each of said contacts and shunt means.

29. A receptable for a coaxial cable terminator that has a center contact and an outer contact generally circumscribing the center contact along an axial extent of the terminator in electrically isolated and spaced relationship, comprising:

center contact means for electrically connecting with the center contact of the terminator, said center contact means including one end of a terminal pin having an opposite end configured for mounting to a printed circuit board;

outer contact means for connecting at an interior surface thereof with the outer contact of the terminator, said outer contact means including a tubular sleeve generally circumscribing said one end of said terminal pin along the axial extent thereof; and spacer means for maintaining electrical isolation and spaced relation of said terminal pin and tubular sleeve, said center contact means and outer contact means being cooperatively interrelated substantially to match the impedance of the coaxial cable, and said tubular sleeve having an annular bottom surface surrounding said terminal pin and from which tab-like extensions co-extend with said opposite end of said terminal pin for mounting to the printed circuit board.

30. A receptable as set forth in claim 29, wherein said spacer means includes a circular disc of electrically nonconductive material concentrically constrained within the interior of said tubular sleeve, said circular disc including a center passage in which said terminal pin is at least partly contained.

31. A receptacle as set forth in claim 29, wherein said terminal pin has an enlarged diameter collar integral therewith end positioned for juxtapositioning between said spacer means and the printed circuit board.

32. A receptacle as set forth in claim 29, in combination with the coaxial cable terminator.

33. A receptacle as set forth in claim 29 wherein said tab-like extensions coextend with said opposite end of said terminal pin for passage through respective holes in a printed circuit board.

34. A receptacle as set forth in claim 33, in combination with a printed circuit board, said printed circuit board including plural holes and plural printed circuit traces, said tab-like extensions passing through respective said holes and said opposite end of said terminal pin passing through another of said holes; first solder means for securing at least one of said tab-like extensions to said printed circuit board and for electrically connecting said one tab-like extension to one of said printed circuit traces; and second solder means for electrically connecting said opposite end of said terminal pin to another one of said printed circuit traces.

* * * * *

UNITED STATES PATENT AND TRADEMARK OFFICE

CERTIFICATE OF CORRECTION

PATENT NO. : 4,941,831

DATED : July 17, 1990

INVENTOR(S) : John N. Tengler, et al.

It is certified that error appears in the above-identified patent and that said Letters Patent is hereby corrected as shown below:

Column 8, line 63, replace "1000" with --100--.
Col. 14:
Claim 6, line 7, replace "content" with --contact--.
Col. 14:
Claim 9, line 1, replace "1" with --6--.
Col. 17:
Claim 31, line 3, replace "end" with --and--.

Signed and Sealed this

Twenty-second Day of September, 1992

*Attest:*

DOUGLAS B. COMER

*Attesting Officer*

*Acting Commissioner of Patents and Trademarks*